(12) United States Patent
Wang (10) Patent No.: US 8,339,886 B2
(45) Date of Patent: Dec. 25, 2012

(54) AMPLIFIER SENSING (75) Inventor: Bing Wang, Palo Alto, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 132 days.

(21) Appl. No.: 13/026,565

(22) Filed: Feb. 14, 2011

(65) Prior Publication Data

US 2012/0206986 A1 Aug. 16, 2012

(51) Int. Cl.
*G11C 7/00* (2006.01)

(52) U.S. Cl. ..... 365/205; 365/206; 365/207; 365/210.1; 365/210.15

(58) Field of Classification Search ............ 365/205, 365/206, 207, 210.1, 201.15
See application file for complete search history.

(56) References Cited

U.S. PATENT DOCUMENTS

| | | | | |
|---|---|---|---|---|
| 6,252,813 B1 * | 6/2001 | Liu | | 365/189.09 |
| 6,438,035 B2 * | 8/2002 | Yamamoto et al. | | 365/185.21 |
| 7,502,273 B2 * | 3/2009 | Liaw | | 365/210.15 |
| 7,826,284 B2 * | 11/2010 | La Placa et al. | | 365/196 |

* cited by examiner

*Primary Examiner* — Pho M Luu
(74) *Attorney, Agent, or Firm* — Lowe Hauptman Ham & Berner, LLP (57) ABSTRACT

A circuit comprises a first read bit line, a second read bit line, and a sense amplifier. First and second read bit lines couple a plurality of memory cells and a reference cell of a memory array, respectively. The sense amplifier is configured to receive the first read bit line as a first input and the second read bit line as a second input. When a memory cell of the first plurality of memory cells is read, the memory cell is read activated, the first reference cell is configured to be off, the second reference cell is configured to be on, and the sense amplifier is configured to provide an output reflecting a data logic stored in the memory cell based on a voltage difference between a first voltage of the first read bit line and a second voltage of the second read bit line.

20 Claims, 8 Drawing Sheets

AMPLIFIER SENSING

FIELD

The present disclosure is related to amplifier sensing.

BACKGROUND

Generally, single-ended sensing for SRAM memory cells requires a full swing of the read bit line. Developing the full swing, however, takes time, especially in situations where a bit line is coupled to a large number of memory cells that result in a read bit line having a large load. Waiting for a full swing to be developed before sensing results in a slow read operation.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art. Reference numbers may be repeated throughout the embodiments, but they do not require that feature(s) of one embodiment apply to another embodiment, even if they share the same reference number.

Some embodiments have one or a combination of the following features and/or advantages. The generated reference voltage is stable because fluctuations are prevented. Read bit lines that otherwise would be idle during a memory access are used in the sensing scheme. As a result, additional circuits and die areas for reference bit lines and/or reference voltages are not required. Transistors in a reference bit cell are configurable to generate a desired reference voltage. Capacitance on a reference read bit line is about the same as that of capacitance on a read bit line. Consequently, sensing based on the reference read bit line and the read bit line is accurate. The sensing speed in various embodiments is about doubled the sensing speed in another approach.

Exemplary Memory

Figure 1:
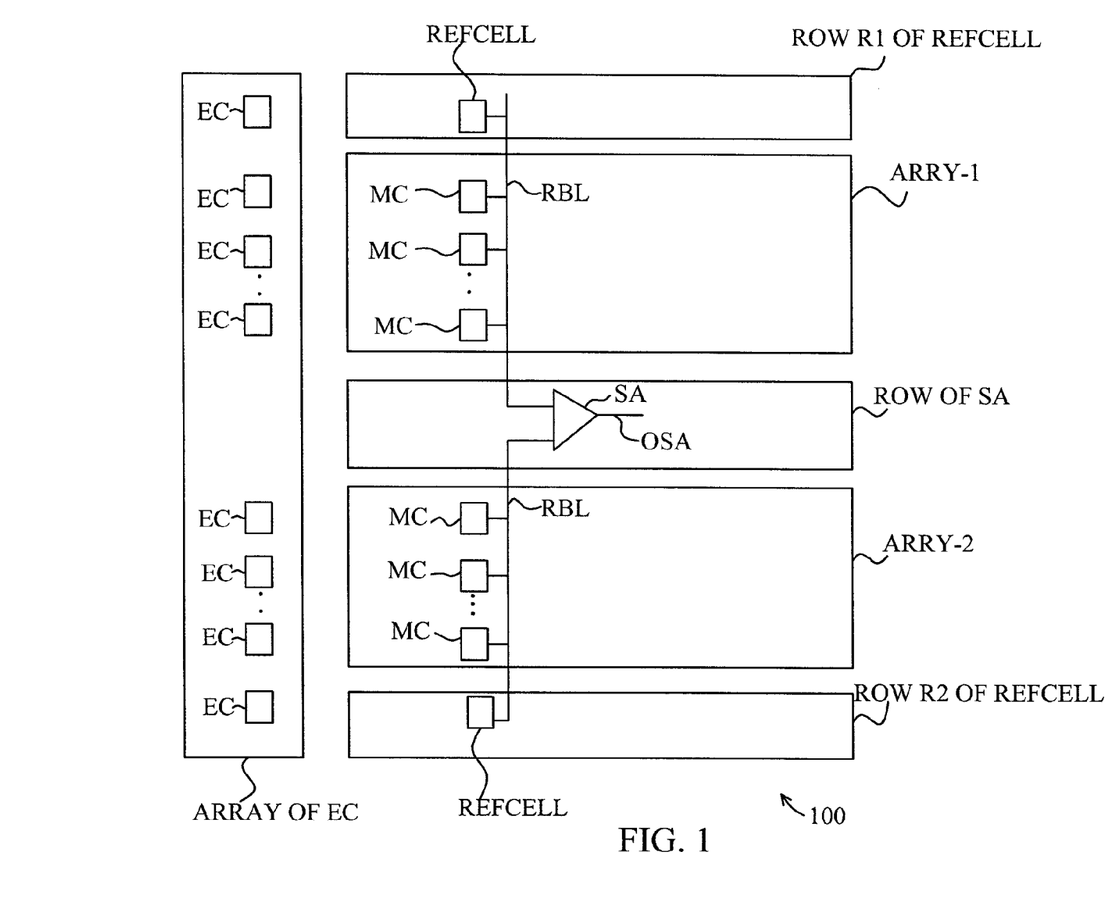
FIG. 1 is a block diagram of a memory, in accordance with some embodiments.

FIG. 1 is a block diagram of an illustrative memory 100, in accordance with some embodiments.

A memory array of memory cell 100 includes a plurality of memory cells arranged in rows and columns. For illustration, memory 100 is shown having a memory array ARRY-1 and a memory array ARRY-2. Each of the memory arrays ARRY-1 and ARRY-2 is shown with one illustrative column. In some embodiments, in a read cycle, a plurality of memory cells of different columns on the same row is read. A memory cell having data to be read is called a memory cell RDMC (illustrated in FIG. 4).

A read bit line RBL of a memory array couples a plurality of memory cells MC and a reference cell REFCELL in the same column of the same memory array. For example, a read bit line RBL of column 1 of memory array ARRY-1 couples a plurality of memory cells MC and a reference cell REFCELL in column 1 of memory array ARRY-1. A read bit line RBL of column 2 of memory array ARRY-1 couples a plurality of memory cells MC and a reference cell REFCELL in column 2 of memory array ARRY-1. A read bit line RBL of column 3 of memory array ARRY-1 couples a plurality of memory cells MC and a reference cell REFCELL in column 3 of memory array ARRY-1, etc. Similarly, a read bit line RBL of column 1 of memory array ARRY-2 couples a plurality of memory cells MC and a reference cell REFCELL in column 1 of memory array ARRY-2. A read bit line RBL of column 2 of memory array ARRY-2 couples a plurality of memory cells MC and a reference cell REFCELL in column 2 of memory array ARRY-2. A read bit line RBL of column 3 of memory array ARRY-2 couples a plurality of memory cells MC and a reference cell REFCELL in column 3 of memory array ARRY-2, etc.

A read bit line RBL that carries the data of a memory cell to be read RDMC is called a read bit line RDRBL (illustrated in FIG. 4) The voltage value on a read bit line RDRBL is called voltage VRDRBL (lot labeled). A read bit line RBL used as a reference bit line is called a reference bit line REFRBL (illustrated in FIG. 4). The voltage value on a reference bit line REFRBL is called voltage VREFRBL (not labeled). In some embodiments, when a memory cell RDMC to be read is in a first memory array ARRY-1, the read bit line RBL coupled to the memory cell RDMC in the first memory array ARRY-1 is used as a read bit line RDRBL. In addition, the corresponding read bit line on the same column in memory array ARRY-2 is used as a reference read bit line REFRBL. Further, a reference cell REFCELL coupled to reference read bit line REFRBL is used as a reference cell, and is called reference cell RDREFCELL (illustrated in FIG. 4). Similarly, when a memory cell RDMC to be read is in a second memory array ARRY-2, the read bit line RBL coupled to the memory cell RDMC in memory array ARRY-2 is used as a read bit line RDRBL. In addition, the corresponding read bit line RBL and reference cell REFCELL on the same column in memory array ARRY-1 are used as a reference bit line REFRBL and a reference cell RDREFCELL, respectively.

A row of sense amplifiers SA is shared between two memory arrays, e.g., memory array ARRY-1 and memory array ARRY-2. For illustration, only one sense amplifier SA of the row of sense amplifiers is shown. A sense amplifier SA receives a read bit line RBL from the first memory array ARRY-1 as a first input, and receives a read bit line RBL from the second memory array ARRY-2 as a second input. A sense amplifier used to sense the data of a memory cell RDMC is called a sense amplifier RDSA (illustrated in FIG. 4). When a memory cell RDMC is read, sense amplifier RDSA senses the voltage difference between voltage VRDRBL of read bit line RDRBL and voltage VREFRBL of reference bit line VRE- FRBL. Sense amplifier RDSA then provides the appropriate data at output OSA that reflects the data stored in memory cell RDMC.

A reference cell REFCELL is used to generate a voltage VREFRBL on the reference bit line REFRBL. Voltage VREFRBL is used as a reference voltage for sense amplifier RDSA. A memory array is associated with a row of reference cells REFCELL. In FIG. 1, memory array ARRY-1 is associated with a row R1 of reference cells REFCELL, and memory array ARRY-2 is associated with a row R2 of reference cells REFCELL. For illustration, each of rows R1 and R2 is shown having only one reference cell REFCELL. A reference cell REFCELL associated with array ARRY-1 is coupled to a plurality of memory cells MC in a corresponding column of array ARRY-1. A reference cell REFCELL associated with array ARRY-2 is coupled to a plurality of memory cells MC in a column of array ARRY-2. A reference cell REFCELL selected to generate a reference voltage VREFRBL is called a reference cell RDREFCELL. In some embodiments, a reference cell RDREFCELL is in the same column in the same memory array of the reference bit line REFRBL. For example, if the reference bit line REFRBL is in column 1 of memory array ARRY-1, then reference cell RDREFCELL is also in column 1 of memory array ARRY-1. But if, the reference bit line REFRBL is in column 1 of memory array ARRY-2, then reference cell RDREFCELL is in column 1 of memory array ARRY-2, etc.

An array of edge cells EC functions such that inside memory cells perform in the same manner. For example, without edge cells EC, the memory cells at the edge of the memory array can have performance different from performance of memory cells not at the edge. In some embodiments, edge cells EC also serve as ground paths for reference cells RDREFCELL used in reading a memory cell.

Exemplary Memory Cell

Figure 2:
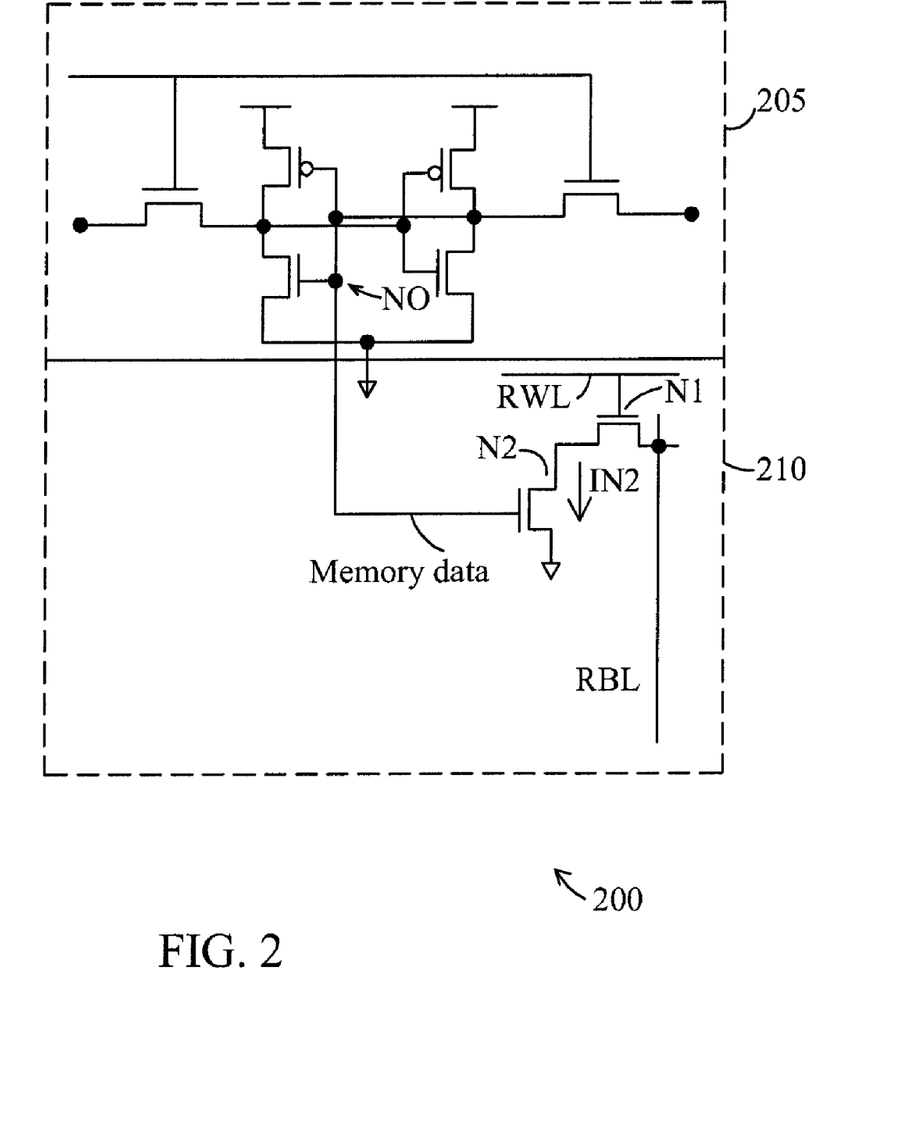
FIG. 2 is a detailed circuit of a memory cell of the memory in FIG. 1, in accordance with some embodiments.

FIG. 2 is a circuit 200 illustrating details of a memory cell, in accordance with some embodiments.

Circuit 205 commonly known in the art is called a six transistor or a 6-T cell because circuit 205 includes six transistors. The functional detail of circuit 205 is not described. Circuit 210 is called a read circuit for circuit 200. Circuit 200 is called an eight-transistor or 8-T memory cell because circuit 200 includes six transistors in 6-T cell 205 and two transistors N1 and N2 in circuit 210.

A read word line RWL is used to activate or select the memory cells coupled to read word line RWL. For illustration, when memory cell 200 is read, read word line RWL is called RDRWL (not labeled) and is activated by being applied with a High. Because read word line RDRWL at the gate of transistor N1 is High, transistor N1 is turned on. Before reading or sensing, read bit line RDRBL is pre-charged to a high voltage level (e.g., a High). The term "pre-charge" is used instead of "charge" because read bit line RDRBL is charged prior to being read. If the data at storage node NO that appears at the gate of transistor N2 is High, transistor N2 is turned on. Transistors N1 and N2 being on cause current IN2 to flow from read bit line RDRBL through transistors N1 and N2 to ground. Transistors N1 and N2 also pull the voltage at the drain of transistor N1 towards the voltage at the source of transistor N2. Because the drain of transistor N1 is coupled to read bit line RDRBL and the source of transistor N2 is ground or at a low logic level (e.g., Low), transistors N1 and N2 pull the voltage level at read bit line RDRBL towards a Low. In effect, voltage VRDRBL at read bit line RDRBL is discharged or lowered from the pre-charged high voltage level.

In contrast, when the data at node NO is Low, transistor N2 is off. As a result, transistors N1 and N2 act as open circuits. Consequently, voltage VRDRBL remains at the same pre-charged high voltage level.

Exemplary Reference Cells

FIGS. 3A-3D are four embodiments of a reference cell REFCELL having four embodiments of current sinking circuit 320A-320D. When a reference cell REFCELL is used for reading a memory cell RDMC, a reference cell REFCELL is called reference cell RDREFCELL. Read bit line RBL coupled to reference cell RDREFCELL is called reference bit line REFRBL. Before sensing, reference bit line REFRBL is pre-charged to a High. Reference cell RDREFCELL is used to generate reference voltage VREFRBL on reference bit line REFRBL to be used by a sense amplifier for sensing.

Figure 3A:
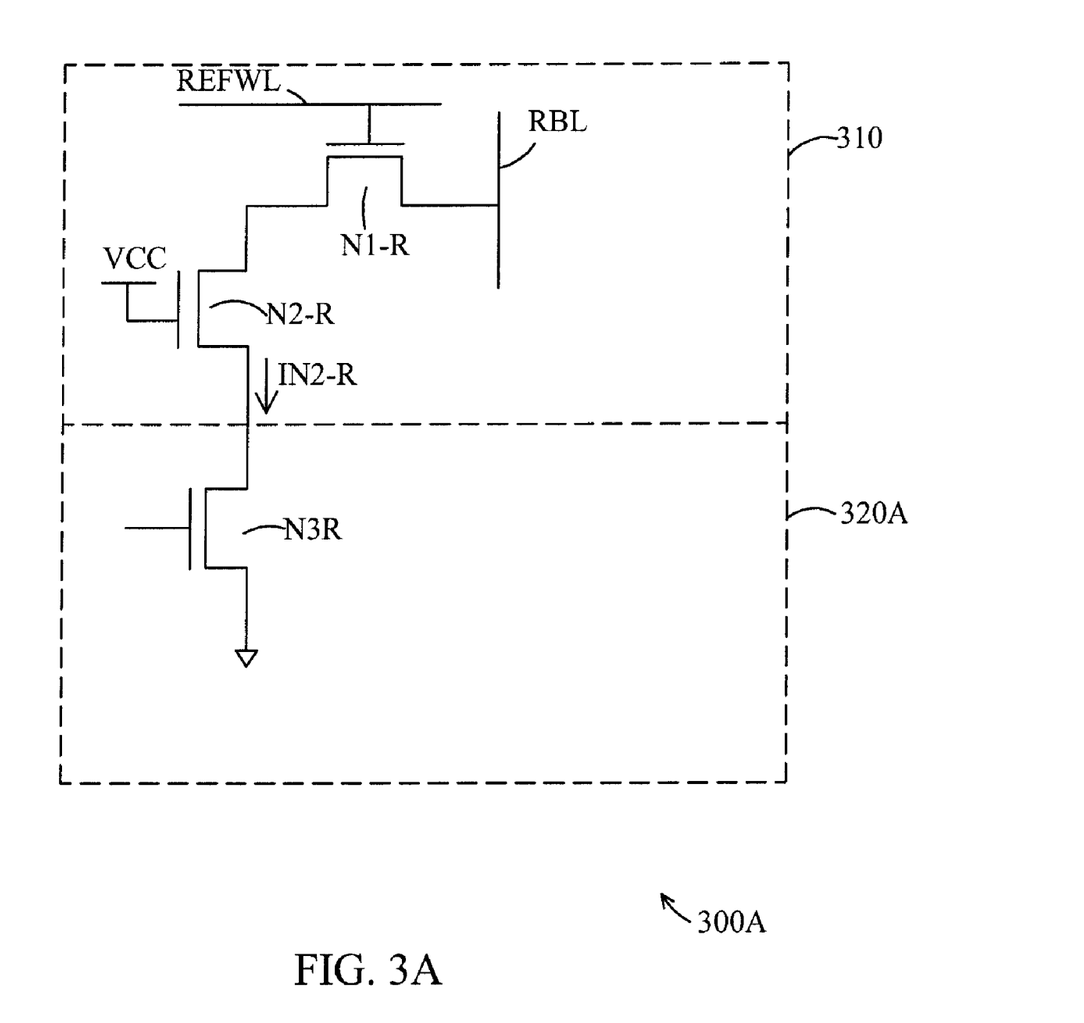
FIGS. 3A-3D are detailed circuits of four illustrative embodiments of a reference cell of the memory in FIG. 1.

FIG. 3A is a diagram of a circuit 300A illustrating details of a reference cell REFCELL, in accordance with a first embodiment. In some embodiments, transistors N1-R and N2-R are core transistors in a memory platform, and have different sizes. Transistor N3R has the same size as that of transistor N1-R or transistor N2-R.

Pull down Circuit 310 corresponds to read circuit 210 of memory cell 200. Transistors N1-R and N2-R are constructed in the same manner as transistors N1 and N2 being constructed in circuit 210, except that the gate of transistor N2-R is coupled to operational voltage VCC while the gate of transistor N2 is coupled to storage node NO. In some embodiments, the current sinking capacity of circuit 310 is about the same as the current sinking capacity of circuit 210. Stated differently, the current sinking capacity of transistors N1-R and N2-R is about the same as the current sinking capacity of transistors N1 and N2 in memory cell RDMC.

Current sinking circuit 320A includes transistor N3-R coupled in series with circuit 310. The drain of transistor N3-R is coupled to the source of transistor N2-R. Circuit 320A through transistor N3-R provides additional resistance for the current path of current IN2-R that flows from reference bit line REFRBL through transistor N1-R, transistor N2-R, and transistor N3-R. As a result, when memory RDMC is accessed and both reference bit line REFRBL and read bit line RDRBL are discharged from a High, current IN2 in FIG. 2 flowing from read bit line RDRBL through transistors N1 and N2 to ground is higher than current IN2-R flowing from reference bit line REFRBL through transistor N1-R, transistor N2-R, and transistor N3-R to ground. Voltage VRDRBL is therefore being discharged more than voltage VREFRBL being discharged. In other words, voltage VRDRBL is lower than voltage VRFERBL.

In some embodiments, because the gate of transistor N2-R is coupled to a high voltage VCC, transistor N2-R is always on. The gate of transistor N1-R is coupled to the reference word line REFWL. When reference cell RDREFCELL is used in sensing a corresponding memory cell RDMC, reference word line REFWL is called RDREFWL, and is applied with a High. As a result, transistor N1-R is turned on. Transistors N1-R and N2-R being on pull voltage VREFRBL of reference bit line REFRBL down towards the low voltage level at the source of transistor N2-R or the drain of transistor N3-R. The voltage level VREFRBL at reference bit line REFRBL is used as a reference voltage by a sense amplifier RDSA. In some embodiments, a plurality of sources of corresponding transistors N2-R in different columns is coupled together.

Figure 3B:
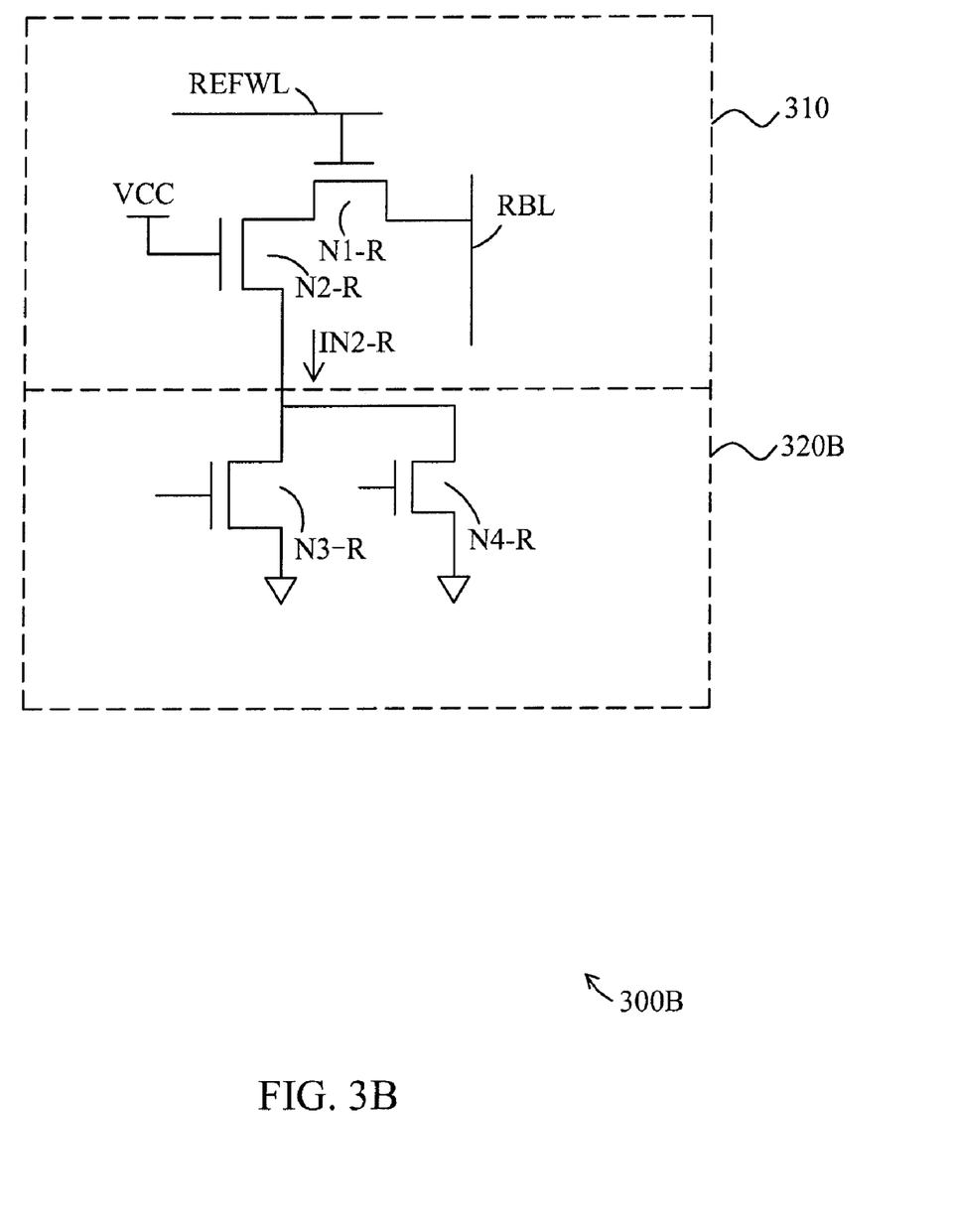
Figure 3C:
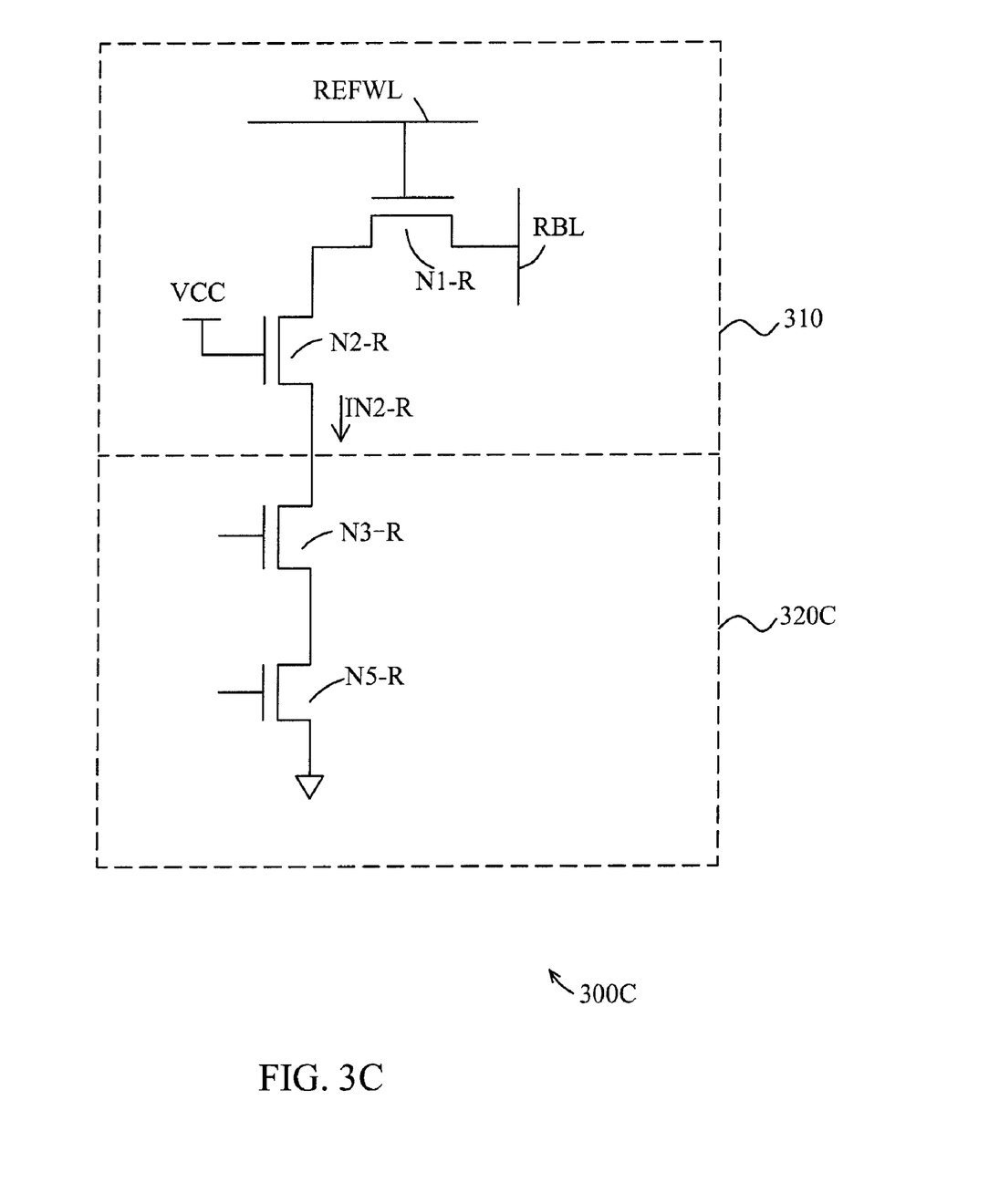
Figure 3D:
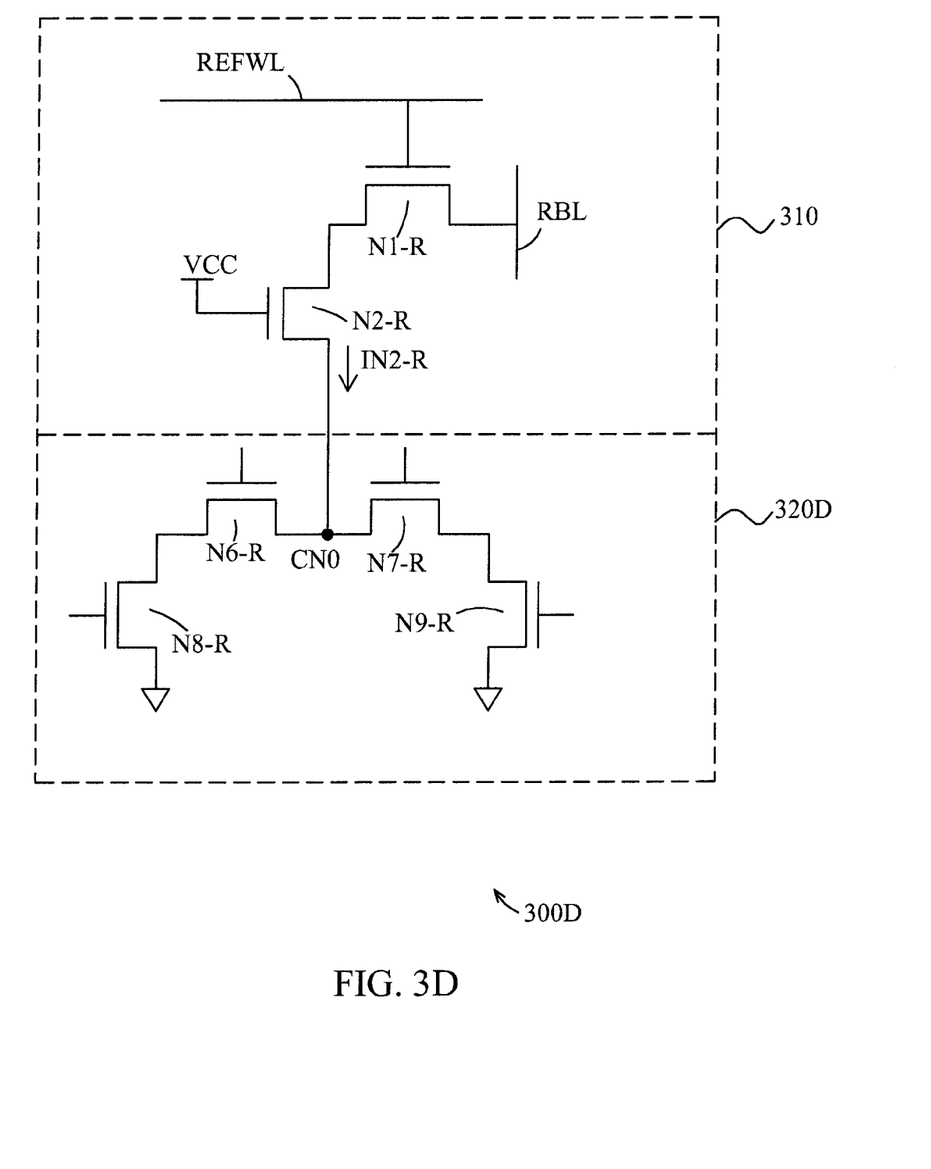

In FIGS. 3B-3D, for illustration, circuit 310 is activated. Transistors N1-R and N2-R are on by applying a High to reference word line RDREFWL.

FIG. 3B is a diagram of a circuit 300B illustrating details of a reference cell REFCELL, in accordance with a second embodiment. Compared with circuit 300A, circuit 300B includes circuit 320B as a second embodiment of circuit 320A.

Compared with circuit 320A, circuit 320B additionally includes transistors N4-R coupled in parallel with transistor N3-R. That is, the drain of transistor N4-R is coupled to the drain of transistor N3-R. As a result, current IN2-R also flows through transistor N4-R in addition to flowing through transistor N3-R.

Circuit 320B is used for illustration, one or more additional transistor N4-R coupled in parallel and/or in series that are coupled in parallel with transistor N3-R are within the scope of various embodiments.

FIG. 3C is a diagram of a circuit 300C illustrating details of a reference cell REFCELL, in accordance with a third embodiment. Compared with circuit 300A, circuit 300C includes circuit 320C as a third embodiment of current sinking circuit 320A.

Compared with circuit 320A, circuit 320C additionally includes transistors N5-R coupled in series with transistor N3-R. The drain of transistor N5-R is coupled to the source of transistor N3-R. When transistors N3-R and N5-R are on, current IN2-R flows through transistor N3-R and N5-R.

Circuit 320C is used for illustration, one or more additional transistor N5-R coupled in parallel and/or in series that are coupled in series with transistor N3-R are within the scope of various embodiments.

FIG. 3D is a diagram of a circuit 300D illustrating details of a reference cell REFCELL, in accordance with a fourth embodiment. Compared with circuit 300A, circuit 300D includes circuit 320D as a fourth embodiment of current sinking circuit 320A. In some embodiments, a circuit 320D is an embodiment of an edge cell EC of FIG. 1.

In circuit 320D, transistor N6-R is coupled in series with transistor N8-R while transistor N7-R is coupled in series with transistor N9-R. The drains of transistors N6-R and N7-R are coupled together and form coupling node CNO coupled to the source of transistor N2-R. When transistors N6-R, N8-R, N7-R, and N9-R are on, current IN2-R flows through transistors N6-R, N8-R, N7-R, and N9-R to ground. Depending on applications, various numbers of circuits 320D are coupled to the source of transistor N2-R via coupling nodes CNO to serve as ground paths for circuit 310.

Circuits 300A-300D are used for illustration. Different numbers of transistors with different parallel and/or series configurations that are coupled to the source of transistor N2-R are within the scope of various embodiments. Each configuration results in a different resistance that affects the flow of current IN2-R, which, in turn, affects the voltage level of reference voltage VREFRBL. In some embodiments, reference voltage VREFRBL is set at a predetermined value. A number of transistors are then configured in a combination of parallel and/or series manner to achieve the predetermined voltage value VREFRBL. In some embodiments, when there is a plurality of transistors coupled to the source of transistor N2-R, the transistors are programmable to be turned on or off. For example, various transistors are turned on or off to set reference voltage VREFRBL to a predetermined value. In other words, the value of voltage VREFRBL is based on the number of transistors that are turned on to serve as current paths for current IN2-R. Persons of ordinary skill in the art will recognize that a transistor is turned on or off based on the voltage applied at its gate.

In some embodiments, a plurality of sources of corresponding transistors N2-R in different columns is coupled to the same node CNO, and a plurality of memory cells in a plurality of columns are read at the same time. In different embodiments of reference cell REFCELL illustrated in FIGS. 3A-3D, more than one transistor is coupled to the source of transistor N2-R and serves as a current path for current IN2-R. As a result, current IN2-R is stable. Because current IN2-R is used to pull down or discharge voltage VREFRBL at reference bit line REFRBL and current IN2-R is stable, voltage VREFRBL is stable. Various embodiments prevent VRERBL fluctuations by configuring appropriate number of transistors in current sinking circuit 320 being turned on and/or off.

Reference cells 300A-300D are used for illustration, other mechanisms used to generate reference voltage VREFRBL are within the scope of various embodiments. A current sinking circuit is an example of such a mechanism. The current sinking circuit is configured with a current sinking capacity to achieve a predetermined voltage VREFRBL. Alternatively described, the current sinking circuit is a current source configured to provide a current to pull voltage VREFRBL to the predetermined value.

Amplifier Sensing

Figure 4:
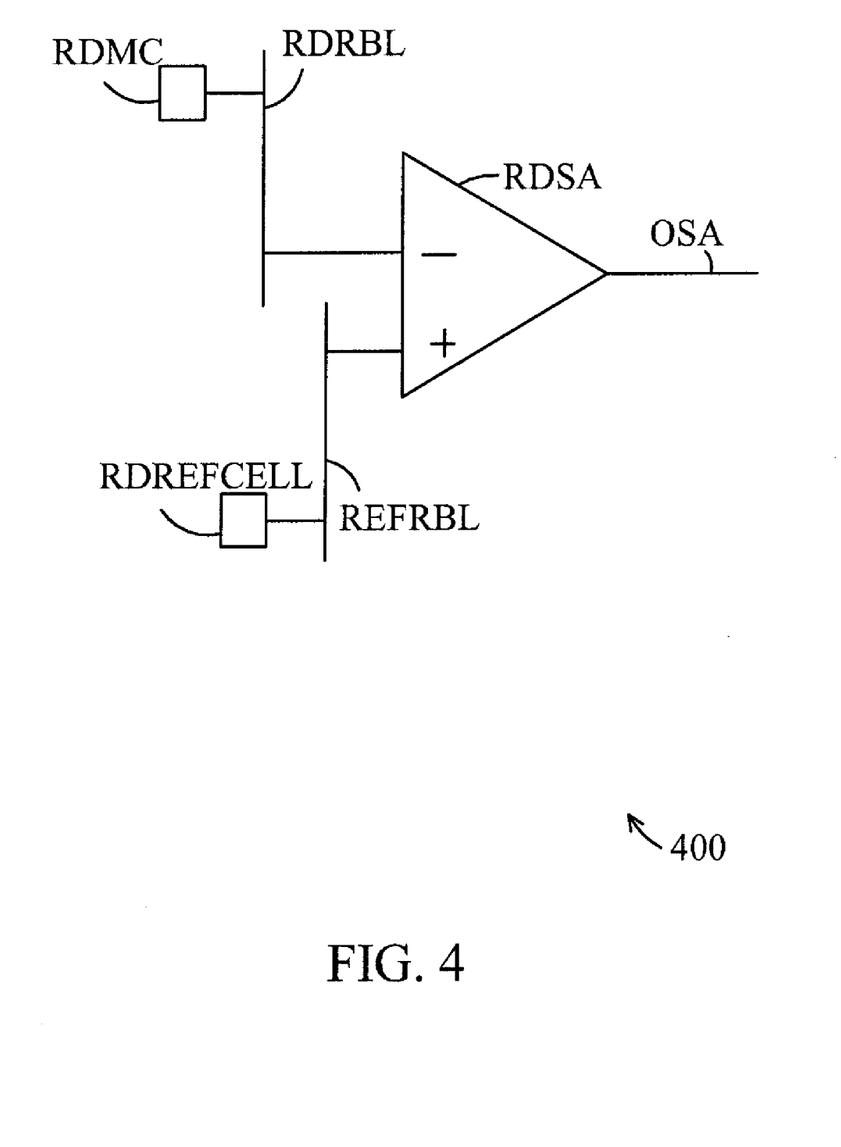
FIG. 4 is diagram of a sense amplifier illustrating a configuration to sense a memory cell of the memory in FIG. 1, in accordance with some embodiments.

FIG. 4 is a diagram of a sensing circuit 400, in accordance with some embodiments. In this illustration, a sense amplifier SA is selected to sense a memory cell to be read RDMC, and is called sense amplifier RDSA. The memory cell to be read RDMC is coupled to a corresponding read bit line RDRBL. Similarly, a reference cell RDREFCELL coupled to a corresponding reference read bit line REFRBL has also been selected to generate reference voltage VREFRBL.

For illustration, reference bit line REFRBL having voltage VREFRBL is fed to the positive input of sense amplifier RDSA. Read bit line RDRBL having voltage VRDRBL is fed to the negative input of sense amplifier RDSA. At time of sensing, sense amplifier RDSA senses the voltage difference between voltage VREFRBL and voltage VRDRBL. If voltage VREFRBL is higher than voltage VRDRBL, then sense amplifier RDSA provides a High at its output OSA. But if voltage VREFRBL is lower than voltage VRDRBL, then sense amplifier RDSA provides a Low at its output OSA. In both situations, the logic level provided by sense amplifier RDSA reflects the data stored in memory cell 200. For example, when the data at node NO in memory cell 200 is High, voltage VRDRBL of read bit line RDRBL is discharged by transistor N1 and N2 of circuit 200. At the same time, voltage VREFRBL at reference bit line REFRBL is discharged by transistor N1-R and N2-R of circuit 300. In some embodiments, the current path from reference read bit line REFRBL to ground has more resistance than the current path from read bit line RDRBL to ground. As a result, current IN2 flowing through read bit line RDRBL is about double current IN2-R flowing through reference bit line REFRBL, which causes voltage VRDRBL being discharged more than voltage VREFRBL being discharged. Consequently, voltage VREFRBL is higher than voltage VRDRBL. Sense amplifier RDSA thus provides a High. In contrast, when the data at node NO is Low, voltage VRDRBL at read bit line RDRBL remains at the pre-charged high voltage level while voltage VREFRBL at reference bit line REFRBL is discharged. In effect, voltage VREFRBL is lower than voltage VRDRBL. As a result, sense amplifier RDSA provides a Low.

In some embodiments, read bit lines RBL of a first memory array ARRY-1 have about the same capacitance as those of a second memory array ARRY-2. Further, if read bit line RDRBL is from memory array ARRY-1, then reference bit line REFRBL is from memory ARRY-2, and vice versa. As a result, the capacitance of a read bit line RDRBL is about the same as the capacitance of a reference bit line REFRBL. In such a situation, sense amplifier RDSA receives two input signals having about the same capacitance, and therefore provides reliable results that would otherwise be affected if read bit line RDRBL and reference read bit line REFRBL have difference capacitances.

Exemplary Method

Figure 5:
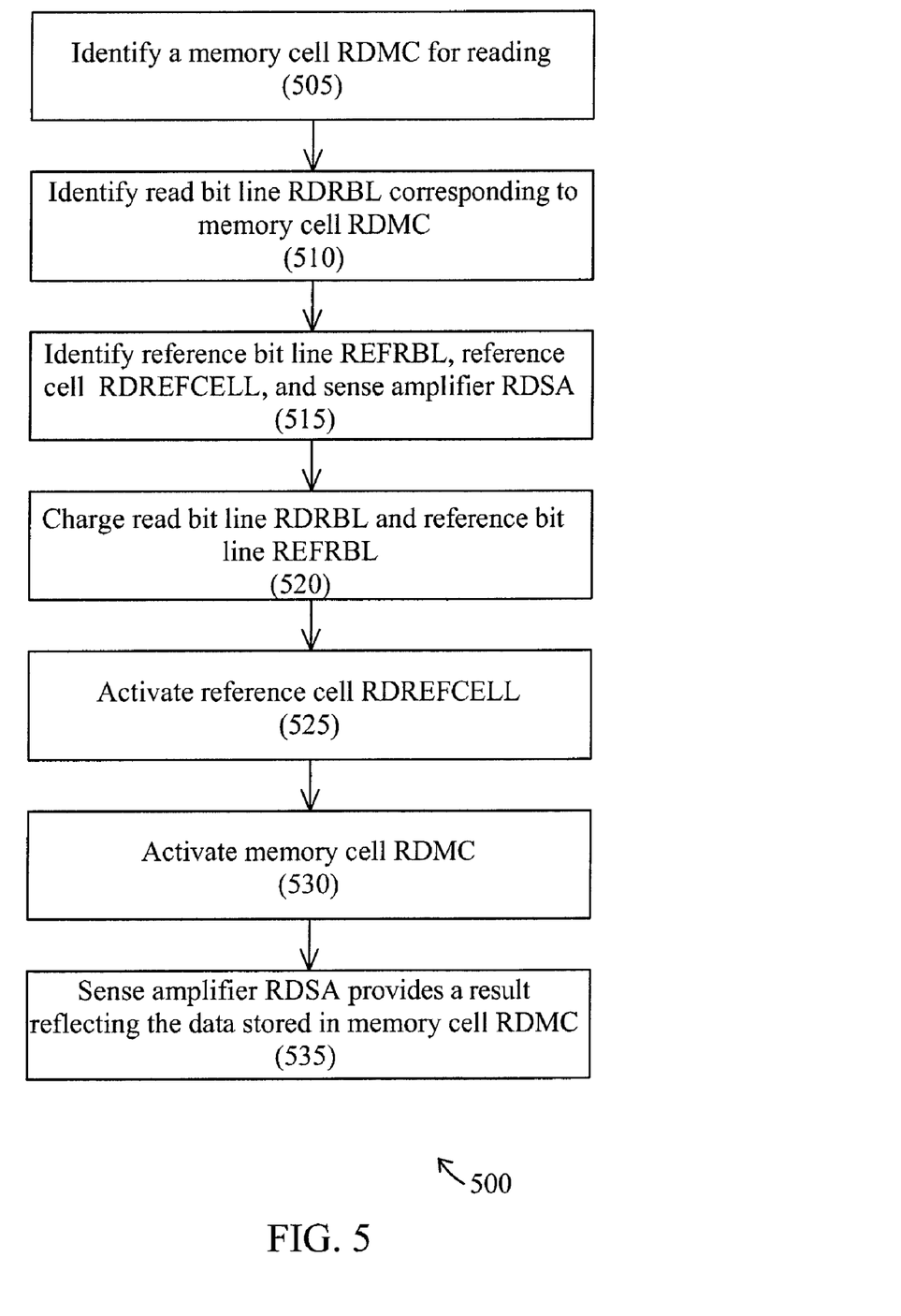
FIG. 5 is a flow chart of a method illustrating reading a memory cell of FIG. 1, in accordance with some embodiments.

FIG. 5 is a flowchart 500 illustrating a method of reading data stored in a memory cell, in accordance with some embodiments.

In step 505, a memory cell in memory array ARRY-1 is identified for reading. The identified memory cell is called RDMC. For illustration, memory cell RDMC is in column 1 of memory array ARRY-1.

In step 510, a corresponding read bit line coupled to memory cell RDMC and carrying the data for memory cell RDMC is identified. This read bit line is called read bit line RDRBL. Because memory cell RDMC is in column 1 of memory array ARRY-1, read bit line RDRBL is in column 1 of memory array ARRY-1.

In step 515, a reference read bit line, a reference cell, and a sense amplifier corresponding to memory cell RDMC are identified to generate a reference voltage for use in reading the data stored in memory cell RDMC. The identified reference read bit line, reference cell, and sense amplifier are called reference bit line REFRBL, reference cell RDREFCELL, and read sense amplifier RDSA, respectively. In this illustration, because the selected memory cell RDMC is in column 1 of memory array ARRY-1, reference bit line REFRBL and reference RDREFCELL are in column 1 of memory array ARRY-2. Further, sense amplifier RDSA is also in column 1 and is shared between memory array ARRY-1 and memory array ARRY-2. In effect, the read bit line RBL of column 1 of memory array ARRY-1 and the read bit line RBL of column 1 of memory ARRY-2 that are coupled to the inputs of sense amplifier RDSA are read bit line RDRBL and reference read bit line REFRBL, respectively.

In step 520, read bit line RDRBL and reference bit line REFRBL are pre-charged to a High, resulting in voltages VRDRBL and VREFRBL being High.

In step 525, reference word line RDREFWL corresponding to reference cell RDREFCELL is activated to turn on transistor N1-R of reference cell RDREFCELL. As a result, transistor N1-R and N2-R of reference cell RDREFCELL discharges reference read bit line REFRBL. Voltage VREFRBL is therefore lowered from the pre-charge high voltage level. Voltage VREFRBL is then used as a reference voltage for sense amplifier RDSA.

In step 530, read word line RDRWL corresponding to memory cell RDMC is activated to activate memory cell RDMC. Transistor N1 of memory cell RDMC is therefore turned on. As a result, if the data stored in memory cell RDMC is High, then transistor N1 and N2 of memory cell RDMC discharges voltage VRDRBL of read bit line RDRBL. In this situation, voltage VRDRBL is lower than voltage VREFRBL because voltage VRDRBL is discharged more than voltage VREFRBL being discharged. But if the data stored in memory cell RDMC is Low, then voltage VRDRBL remains at the pre-charge high voltage level. In this situation, voltage VRDRBL is higher than voltage VREFRBL because voltage VRDRBL remains at the same pre-charge voltage level while voltage VREFRBL is discharged.

In step 535, sense amplifier RDSA, based on the difference between voltage VREFRBL and VRDRBL, provides the result reflecting the data stored in memory cell RDMC. For example, if reference bit line REFRBL is coupled to the positive input of sense amplifier RDSA and read bit line RDRBL is coupled to the negative input of sense amplifier RDSA, then sense amplifier RDSA provides a High when voltage VREFRBL is higher than voltage VRDRBL. But if voltage VREFRBL is lower than voltage VRDRBL, then sense amplifier RDSA provides a Low. In contrast, if reference bit line REFRBL is coupled to the negative input of sense amplifier RDSA and read bit line RDRBL is coupled to the positive input of sense amplifier RDSA, then sense amplifier RDSA provides a Low when voltage VREFRBL is higher than voltage VRDRBL. But if voltage VREFRBL is lower than voltage VRDRBL, then sense amplifier RDSA provides a High.

The above example in method 500 is used for illustration. Reading more than one memory cell each in a different column at the same time is within the scope of various embodiments. Reading memory cell(s) in a different column and/or different array is performed similarly to reading the memory cell as illustrated in the example of FIG. 5, and should be recognized by persons of ordinary skill in the art. For example, if the memory cell to be read RDMC is in column 1 of array ARRY-2, then read bit line RBL of array ARRY-2 coupled to memory cell RDMC is read bit line RDRBL. Read bit line RBL and reference cell REFCELL in column 1 of memory array ARRY-1, however, are selected as respective reference bit line REFRBL and reference cell RDREFCELL, etc.

A number of embodiments have been described. It will nevertheless be understood that various modifications may be made without departing from the spirit and scope of the disclosure. For example, the various transistors being shown as a particular dopant type (e.g., N-type or P-type Metal Oxide Semiconductor (NMOS or PMOS)) are for illustration purposes, embodiments of the disclosure are not limited to a particular type. Selecting different dopant types for a particular transistor is within the scope of various embodiments. The low or high logic level (e.g., Low or High) of the various signals used in the above description is also for illustration. Various embodiments are not limited to a particular level when a signal is activated and/or deactivated, and selecting different levels is within the scope of various embodiments.

Some embodiments regard a circuit comprising a first read bit line, a second read bit line, and a sense amplifier. The first read bit line couples a first plurality of memory cells of a first memory array and a first reference cell. The first read bit line has a first read bit line voltage. The second read bit line couples a second plurality of memory cells of a second memory array and a second reference cell. The second read bit line has a second read bit line voltage. The sense amplifier is configured to receive the first read bit line as a first input and the second read bit line as a second input. When a memory cell of the first plurality of memory cells is read, the memory cell is read activated, the first reference cell is configured to be off, the second reference cell is configured to be on, and the sense amplifier is configured to provide a result reflecting a data logic stored in the memory cell based on a voltage difference between the first read bit line voltage and the second read bit line voltage.

Some embodiments regard a memory comprising a first memory array, a second memory array, and a sense amplifier.

The first memory array includes a first reference cell, a first plurality of memory cells, and a first read bit line coupled to the first plurality of memory cells and the first reference cell. The second memory array includes a second reference cell, a second plurality of memory cells, and a second read bit line coupled to the second plurality of memory cells and the second reference cell. The sense amplifier is configured to receive the first read bit line as a first input and the second read bit line as a second input. Each memory cell of the first plurality of memory cells and of the second plurality of memory cells includes a first memory transistor having a first memory drain, a first memory source, and a first memory gate, a second memory transistor having a second memory drain, a second memory source, and a second memory gate. The first memory drain is coupled to the first read bit line. The first memory source is coupled to the second memory drain. Each of the first reference cell and of the second reference cell includes a first reference transistor having a first reference drain, a first reference source, and a first reference gate, a second reference transistor having a second reference drain, and second reference source, and a second reference gate, and at least one third reference transistor coupled to the second source. The first reference drain is coupled to the second read bit line. The first reference source is coupled to the second reference drain.

Some embodiments regard a method comprising charging a first bit line coupled to a first plurality of memory cells and a first input of an amplifier and a second bit line coupled to a second plurality of memory cells and a second input of the amplifier to a high voltage value; the first bit line and the second bit line thereby having a first bit line high voltage value and a second bit line high voltage value; lowering the first bit line high voltage value, resulting in a reference voltage value lower than the second bit line high voltage value; using data stored in a memory cell electrically coupled to the second bit line to cause the second bit line high voltage value to remain the same or to be lower than the reference voltage value; and the sense amplifier providing an output reflecting the data stored in the memory cell based on a voltage difference between the reference voltage value and a voltage value on the second bit line.

The above methods show exemplary steps, but they are not necessarily performed in the order shown. Steps may be added, replaced, changed order, and/or eliminated as appropriate, in accordance with the spirit and scope of disclosed embodiments.

What is claimed is:

1. A circuit comprising:
    a first read bit line coupling a first plurality of memory cells of a first memory array and a first reference cell; the first read bit line having a first read bit line voltage;
    a second read bit line coupling a second plurality of memory cells of a second memory array and a second reference cell; the second read bit line having a second read bit line voltage; and
    a sense amplifier configured to receive the first read bit line as a first input and the second read bit line as a second input;
    wherein when a memory cell of the first plurality of memory cells is read
        the memory cell is read activated;
        the first reference cell is configured to be off;
        the second reference cell is configured to be on; and
        the sense amplifier is configured to provide a result reflecting a data logic stored in the memory cell based on a voltage difference between the first read bit line voltage and the second read bit line voltage.

2. The circuit of claim 1, wherein before the sense amplifier is configured to provide the result, the first read bit line and the second read bit line are configured to charge to a high voltage level.

3. The circuit of claim 2, wherein the second reference cell is a current sinking circuit configured to pull the second read bit line voltage to a voltage level lower than the charged high voltage level.

4. The circuit of claim 1, wherein the second reference cell includes:
    a pull down circuit that includes a first transistor having a first drain, a first source and a first gate and a second transistor having a second drain, a second source, and a second gate; the first drain is coupled to the second read bit line; the first source is coupled to the second drain; and
    a current sinking circuit coupled to the second source and configured to sink current flowing through the second read bit line, the first transistor, and the second transistor.

5. The circuit of claim 4, wherein:
    the memory cell includes a memory read circuit having a first memory transistor having a first memory drain, a first memory source, and a first memory gate, and a second memory transistor having a second memory drain, a second memory source, and a second memory gate;
    the first memory drain is coupled to the first read bit line; and
    the first memory source is coupled to the second memory drain.

6. The circuit of claim 4, wherein the current sinking circuit includes at least one transistor coupled to the second source.

7. The circuit of claim 4, wherein the current sinking circuit includes at least one first current sinking circuit that includes:
    a third transistor having a third drain, a third source, and a third gate;
    a fourth transistor having a fourth drain, a fourth source, and a fourth gate;
    a fifth transistor having a fifth drain, a fifth source, and a fifth gate; and
    a sixth transistor having a sixth drain, a sixth source, and a sixth gate;
    wherein
        the third drain, the fourth drain, and the second source are coupled together, and serve as a coupling node;
        the third source and the fifth drain are coupled together; and
        the fourth source and the sixth drain are coupled together.

8. The circuit of claim 7, wherein:
    the at least one first current sinking circuit includes a plurality of second current sinking circuits;
    each second current sinking circuit of the plurality of second current sinking circuits corresponds to a row of a memory array; and
    coupling nodes of the plurality of second current sinking circuits are coupled together.

9. The circuit of claim 1, wherein when the memory cell of the first plurality of memory cells is read, the memory cell is configured to sink a memory current and the second reference cell is configured to sink a reference current lower than the memory current.

10. A method comprising:
    charging a first bit line coupled to a first plurality of memory cells and a first input of an amplifier and a second bit line coupled to a second plurality of memory cells and a second input of the sense amplifier to a high voltage value; the first bit line and the second bit line thereby having a first bit line high voltage value and a second bit line high voltage value;

lowering the first bit line high voltage value, resulting in a reference voltage value lower than the second bit line high voltage value;

using data stored in a memory cell electrically coupled to the second bit line to cause the second bit line high voltage value to remain the same or to be lower than the reference voltage value; and the sense amplifier providing an output reflecting the data stored in the memory cell based on a voltage difference between the reference voltage value and a voltage value on the second bit line.

11. The method of claim 10, wherein using the data comprises transferring the data stored in the memory cell to a gate of a transistor; the data causing the second bit line high voltage value to remain the same by keeping the transistor in the off state; the data causing the second bit line high voltage value to be lower than the reference voltage value by having the transistor in the on state.

12. The method of claim 10, wherein lowering the first bit line high voltage value comprises using a current sinking circuit coupled to the first bit line.

13. The method of claim 12, wherein the current sinking circuit includes:
    a first transistor having a first drain, a first source, and first gate;
    a second transistor having a second drain, a second source, and a second gate; and
    at least one third transistor;
    wherein
        the first drain is coupled to the first bit line;
        the first source and the second drain are couple together; and
        the least one third transistor is coupled to the second source.

14. The method of claim 13, wherein the at least one third transistor includes:
    a third transistor having a drain coupled to the second source, and
    at least one fourth transistor coupled in series, or in parallel, or in both series and in parallel with the third transistor.

15. The method of claim 13, wherein the at least one third transistor includes:
    a third transistor having a third drain, a third source, and a third gate;
    a fourth transistor having a fourth drain, a fourth source, and a fourth gate;
    a fifth transistor having a fifth drain, a fifth source, and a fifth gate; and
    a sixth transistor having a sixth drain, a sixth source, and a sixth gate;
    wherein
        the third drain, the fourth drain, and the second source are coupled together, and serve as a coupling node;
        the third source and the fifth drain are coupled together; and
        the fourth source and the sixth drain are coupled together.

16. The method of claim 11 further comprising utilizing a first current to lower the first bit line voltage and using a second current to cause the second bit line high voltage value to be lower than the reference voltage; the second current being higher than the first current.

17. A memory comprising:
    a first memory array including
        a first reference cell;
        a first plurality of memory cells; and
        a first read bit line coupled to the first plurality of memory cells and the first reference cell;
    a second memory array including
        a second reference cell;
        a second plurality of memory cells; and
        a second read bit line coupled to the second plurality of memory cells and the second reference cell; and
    a sense amplifier configured to receive the first read bit line as a first input and the second read bit line as a second input;
    wherein
        each memory cell of the first plurality of memory cells and of the second plurality of memory cells includes
            a first memory transistor having a first memory drain, a first memory source, and a first memory gate;
            a second memory transistor having a second memory drain, a second memory source, and a second memory gate;
        the first memory drain is coupled to the first read bit line;
        the first memory source is coupled to the second memory drain;
        each of the first reference cell and of the second reference cell includes
            a first reference transistor having a first reference drain, a first reference source, and a first reference gate,
            a second reference transistor having a second reference drain, and second reference source, and a second reference gate, and
            at least one third reference transistor coupled to the second source;
        the first reference drain is coupled to the second read bit line; and
        the first reference source is coupled to the second reference drain.

18. The memory of claim 17, wherein the at least one third reference transistor includes a plurality of third reference transistors coupled in one or a combination of parallel and series.

19. The memory of claim 17, wherein:
    the at least one third reference transistor includes
        a third transistor having a third drain, a third source, and a third gate;
        a fourth transistor having a fourth drain, a fourth source, and a fourth gate;
        a fifth transistor having a fifth drain, a fifth source, and a fifth gate; and
        a sixth transistor having a sixth drain, a sixth source, and a sixth gate;
    the third drain, the fourth drain, and the second source are coupled together, and serve as a coupling node;
    the third source and the fifth drain are coupled together; and
    the fourth source and the sixth drain are coupled together.

20. The memory of claim 19, wherein the third transistor, the fourth transistor, the fifth transistor, and the sixth transistor correspond to a row of the memory.

* * * * *